(12) United States Patent
Tsuji

(10) Patent No.: US 7,110,084 B2
(45) Date of Patent: Sep. 19, 2006

(54) ILLUMINATION OPTICAL SYSTEM AND EXPOSURE APPARATUS

(75) Inventor: Toshihiko Tsuji, Tochigi (JP)

(73) Assignee: Canon Kabushiki Kaisha, Tokyo (JP)

( * ) Notice: Subject to any disclaimer, the term of this patent is extended or adjusted under 35 U.S.C. 154(b) by 0 days.

(21) Appl. No.: 10/769,373

(22) Filed: Jan. 30, 2004

(65) Prior Publication Data

US 2005/0057738 A1    Mar. 17, 2005

(30) Foreign Application Priority Data

Sep. 17, 2003 (JP) ............................ 2003-324636

(51) Int. Cl.
G03B 27/42 (2006.01)

(52) U.S. Cl. .......................... 355/53; 355/67; 355/71; 250/548; 378/34; 378/35

(58) Field of Classification Search ..................... None
See application file for complete search history.

(56) References Cited

U.S. PATENT DOCUMENTS

| | | | |
|---|---|---|---|
| 4,861,148 A * | 8/1989 | Sato et al. | 359/366 |
| 5,581,605 A * | 12/1996 | Murakami et al. | 378/34 |
| 5,677,939 A | 10/1997 | Oshino | 378/34 |
| 5,695,277 A * | 12/1997 | Kim | 362/299 |
| 5,995,582 A | 11/1999 | Terashima et al. | 378/34 |
| 6,452,661 B1 | 9/2002 | Komatsuda | 355/67 |
| 6,485,153 B1 * | 11/2002 | Ota | 359/859 |
| 6,504,896 B1 | 1/2003 | Miyake et al. | 378/34 |
| 2003/0031017 A1 | 2/2003 | Tsuji | 362/268 |
| 2004/0080815 A1 * | 4/2004 | Muys et al. | 359/356 |

FOREIGN PATENT DOCUMENTS

| | | |
|---|---|---|
| JP | 63-029930 | 2/1988 |
| JP | 7-235472 A | 9/1995 |
| JP | 10-70058 A | 3/1998 |
| JP | 11-312638 A | 11/1999 |
| JP | 2000-89000 | 3/2000 |
| JP | 2000-100685 | 4/2000 |
| JP | 2003-45774 A | 2/2003 |
| JP | 2003-45784 A | 2/2003 |
| JP | 2003-506747 A | 2/2003 |
| WO | 01/09681 A2 | 2/2001 |
| WO | 01/09681 A3 | 2/2001 |

OTHER PUBLICATIONS

Taiwanese Office Action issued on Mar. 14, 2005.
Korean Patent Office Action issued on of corresponding Korean Patent Application No. 10-2004-0074099 mailed Mar. 22, 2006 (3 pages) and English translation (2 pages).

* cited by examiner

Primary Examiner—D. Rutledge
(74) Attorney, Agent, or Firm—Morgan & Finnegan, LLP

(57) ABSTRACT

Attempting to provide an illumination optical system and an exposure apparatus using the same, which provide a more uniform angular distribution of light for illuminating a mask than the prior art, an illumination optical system for illuminating an object surface includes an optical unit that converts light from a light source section into approximately parallel light, and includes first and second mirrors, wherein the first mirror has an opening, through which light reflected by the second mirror passes.

16 Claims, 15 Drawing Sheets

PRIOR ART

ILLUMINATION OPTICAL SYSTEM AND EXPOSURE APPARATUS

This application claims a benefit of priority based on Japanese Patent Application No. 2003-324636, filed on Sep. 17, 2003, which is hereby incorporated by reference herein in its entirety as if fully set forth herein.

BACKGROUND OF THE INVENTION

The present invention relates generally to an illumination optical system and an exposure apparatus using the same, and more particularly to an illumination optical system that uses a light source in an extreme ultraviolet ("EUV") or X-ray region with a wavelength between 10 nm and 200 nm, and an exposure apparatus that uses the illumination optical system to expose an object, such as a single crystal substrate for a semiconductor wafer, and a glass plate for a liquid crystal display ("LCD").

A reduction projection exposure method that uses, for example, EUV light or X-ray have been proposed as one of methods for manufacturing semiconductor circuit devices having a fine pattern (see, for example, Japanese Patent Application Publication No. 10-70058 (or its U.S. counterpart, U.S. Pat. No. 6,504,896B1), Japanese Patent Application Publication No. 2003-045774 (or its U.S. counterpart, U.S. Patent Application Publication No. 2003031017A1), and Japanese Patent Application Publication No. 2003-045784 (or its U.S. counterpart, U.S. Patent Application Publication No. 2003031017A1)).

This method uses the EUV light to illuminate a mask (or a reticle) that forms a circuit pattern, and projects a reduced size of the pattern on the mask, onto a wafer surface, and to expose photoresist on the wafer surface for pattern transfer.

FIG. 11 schematically shows principal part of a conventional EUV reduction projection exposure apparatus 1000. In FIG. 11, 1001 denotes an EUV light emission point, 1002 denotes EUV light, 1003 denotes a filter, 1004 denotes a first rotational paraboloid mirror, 1005 denotes a reflection integrator, 1006 denotes a second rotational paraboloid mirror, 1007 denotes a reflection mask, 1008 denotes plural mirrors that constitute a projection optical system, 1009 denotes a wafer, 1010 denotes a mask stage, 1011 denotes a wafer stage, 1012 denotes an arc aperture, 1013 denotes a laser light source, 1014 denotes a laser condensing optical system, and 1017 denotes a vacuum chamber. FIG. 13 is a plane view showing a relationship between an illuminated area 1015 on the mask 1007 and an arc area 1016 to be exposed.

The exposure apparatus 1000 thus includes a light source section 1013, 1014 that generates the EUV light, an illumination optical system (i.e., the first rotational paraboloid mirror 1004, the reflection integrator 1005 and the second rotational paraboloid mirror 1006), the reflection mask 1007, the projection optical system 1008, the wafer 1009, the mask mounted stage 1010, the wafer mounted stage 1011, an alignment mechanism (not shown) for precise alignment between mask and wafer positions, the vacuum chamber 1017 that maintains vacuum of the entire optical system vacuum for reduced attenuations of the EUV light, and an exhaust apparatus (not shown).

The illumination optical system uses the first rotational paraboloid mirror 1004 to condense the EUV light 1002 from the emission point 1001 into the reflection integrator 1005 so as to form secondary light sources, and uses the second rotational paraboloid mirror 1006 to superimpose and condense the EUV light from these secondary light sources so as to uniformly illuminate the mask 1007.

The reflection mask 1007 forms a pattern to be transferred, using a non-reflected part made of an EUV absorber on a multilayer mirror. The projection optical system 1008 images, on the wafer 1009, the EUV light that has information of a circuit pattern reflected by the reflection mask 1007.

The projection optical system 1008 is configured to have excellent imaging performance in an off-axis, thin arc area (i.e., apart from an optical-axis center). The aperture 1012 with the arc opening just prior to the wafer 1009 enables exposure to use only this thin arc area. The exposure scans the reflection mask 1007 and the wafer 1009 simultaneously and transfers a rectangular shot on the entire surface of the mask.

The projection optical system 1008 is comprised of plural multilayer mirrors, and configured to project a reduced size of pattern on the mask 1007 onto the wafer 1009 surface. The projection optical system 1008 typically forms an image-side telecentric system, and usually provides an object side (or the reflection mask side) with a non-telecentric structure so as to avoid physical interference with the illumination light incident upon the reflection mask 1007.

The laser condensing optical system 1014 condenses a laser beam from the laser light source 1013 onto a target (not shown) at the emission point 1001, generating a high-temperature plasma light source 1001. The EUV light 1002 thermally radiated from this plasma light source is reflected on the first rotational paraboloid mirror 1004 and turns into parallel EUV light. This light is reflected on the reflection integrator 1005 and forms a multiplicity of secondary light sources.

The EUV light from these secondary light sources is reflected on the second rotational paraboloid mirror 1006 and illuminates the reflection mask 1007. Distances from the secondary light sources to the second rotational paraboloid mirror 1006 and from the secondary rotational paraboloid mirror 1006 to the reflection mask 1007 are set to be equal to a focal distance of the second rotational paraboloid mirror 1006.

Since a focal point of the second rotational paraboloid mirror 1006 is located at positions of the second light sources, the EUV light emitted from the secondary light sources irradiates as parallel light the reflection mask 1007. The projection optical system 1008 is configured to project an image of the secondary light sources onto an entrance pupil surface, and thereby meets the Kohler's illumination conditions. The EUV light that illuminates one point on the reflection mask 1007 is superimposed EUV beams emitted from all the secondary light sources.

The illuminated area 1015 on the mask surface is similar, as shown in FIG. 12, to a plane shape of a concave or convex mirror as an element in the reflection integrator 1005, and it is an approximately rectangular shape that includes the arc shape 1016 to be actually exposed. The projection optical system 1008 is configured to project an image of the secondary light sources onto its pupil surface.

However, the conventional EUV reduction projection exposure apparatus has been disadvantageous, because the rotational paraboloid mirror 1004 has a reflective surface asymmetrical to the optical axis of the EUV light 1002 isotropically emitted from the light source 1001, and cannot uniformly illuminate the reflection integrator 1005. As a result, an angular distribution of light for illuminating the mask 1007 becomes non-uniform, and pattern resolving power deteriorates.

BRIEF SUMMARY OF THE INVENTION

Accordingly, with the foregoing in mind, it is an exemplary object of the present invention to provide an illumination optical system and an exposure apparatus using the same, which provide a more uniform angular distribution of light for illuminating a mask than the prior art.

In order to achieve the above object, an illumination optical system of one aspect according to the present invention for illuminating an object surface includes an optical unit that converts light from a light source section into approximately parallel light, and includes first and second mirrors, wherein the first mirror has an opening, through which light reflected by the second mirror passes.

Other features and advantages of the present invention will be apparent from the following description taken in conjunction with the accompanying drawings, in which like reference characters designate the same or similar parts throughout the figures thereof.

BRIEF DESCRIPTION OF THE DRAWINGS

The accompanying drawings, which are incorporated in and constitute a part of the specification, illustrate embodiments of the invention and, together with the description, serve to explain the principles of the invention.

DETAILED DESCRIPTION OF THE PREFERRED EMBODIMENTS

Preferred embodiments of the present invention will now be described in detail in accordance with the accompanying drawings.

FIRST EMBODIMENT

Figure 1:
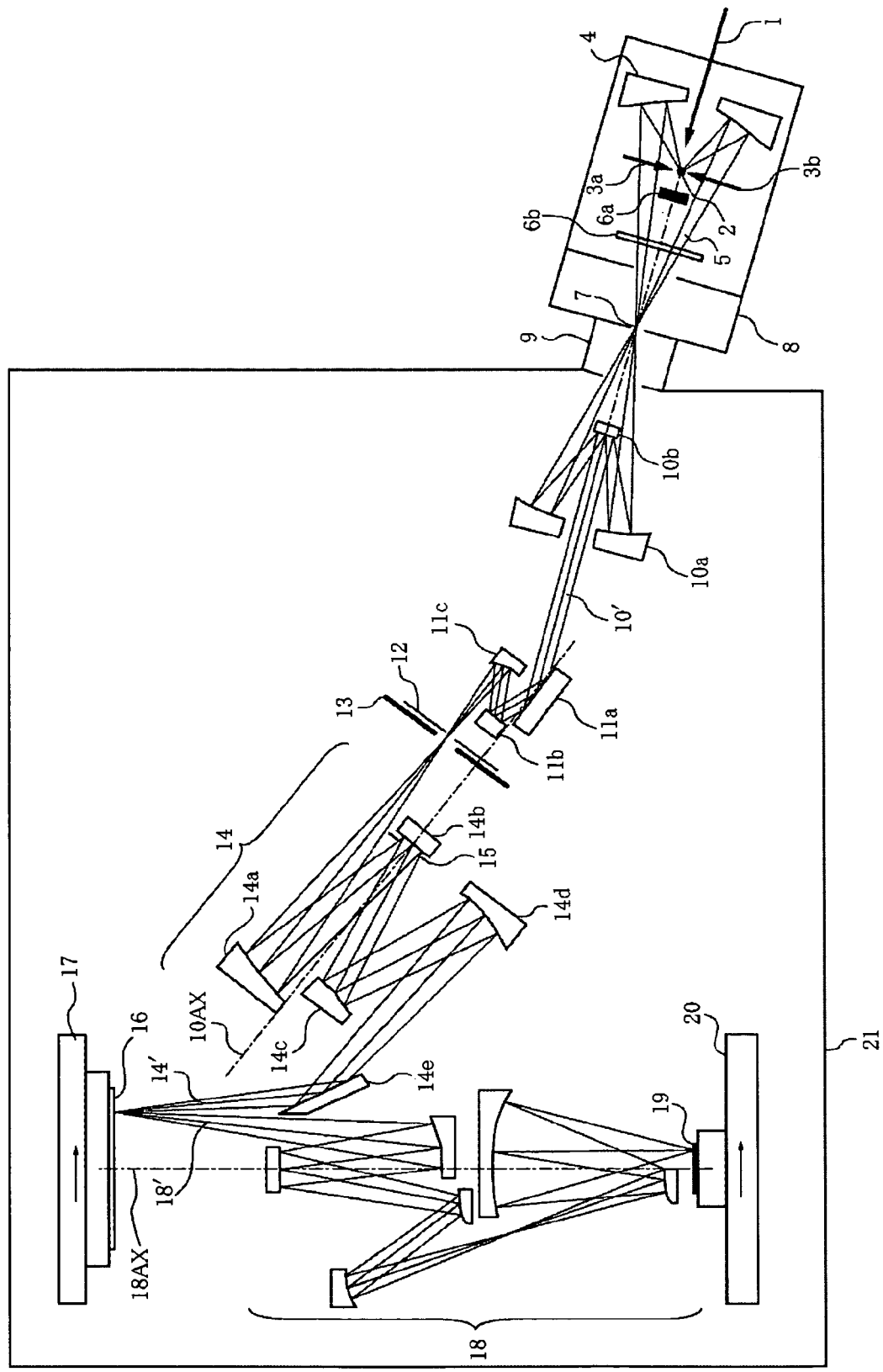
FIG. 1 is a schematic view of an embodiment according to the present invention.

FIG. 1 is a schematic view of an embodiment according to the present invention. As illustrated, 1 denotes an excitation laser beam. 2 denotes a plasma emission point. 3a denotes a nozzle that injects a liquid drop as a target for plasma generations, and 3b denotes a liquid-drop recovery part for recovering and recycling liquid drops that have not received excitation laser beam. 4 denotes a condenser mirror that receives light emitted from the plasma emission point. 6a denotes a filter that removes flying particles (or debris) from the plasma, and 6b denotes a wavelength filter that removes light other than the EUV light. 7 denotes a pinhole aperture arranged at or near the condensed point of the condenser mirror 4. 8 denotes a vacuum chamber that accommodates the plasma light source. These elements constitute a light source section. 5 denotes the EUV light condensed by the mirror 4. 9 denotes a connector that connects an exposure apparatus body to a plasma light source section in a vacuum state.

10a and 10b are part of a parallelizing optical system that receives the EUV light through the aperture 7, converts it into parallel light, and includes a concave mirror and a convex mirror. 11a is an integrator having plural cylindrical mirrors, and 11b and 11c are part of an optical system that includes a rotational paraboloid mirror for condensing the light from the integrator 11a into an arc shape. 12 denotes an arc stop that has an arc opening and a partially variable width. 13 denotes a masking blade for restricting the illumination light to a desired exposed area. 14 denotes a masking imaging system that images at a desired magnification with respect to the masking blade 13 as the object side and the reflection mask 16 as the image side, and forms an arc illuminated area on the reflection mask. 14a, 14b, 14c and 14d, respectively, denote a curved mirror in the masking imaging system 14, and 14e is a plane mirror that reflect the image-side light 14' of the masking imaging system 14 for entry into the reflection mask 16 at a predetermined angle. 15 denotes an aperture stop located at a pupil surface in the masking imaging system 14. These elements constitute an illumination optical system for illuminating the reflection mask 16 with light from the light source section.

17 denotes a mask stage that holds the reflection mask 16, 18 denotes a projection optical system that includes plural mirrors, 19 denotes a wafer that applies a photosensitive material, 20 denotes a wafer stage that holds the wafer 19, and 21 denotes a vacuum chamber that maintains the entire optical system in the vacuum atmosphere for reduced attenuation of the EUV light.

The high power excitation pulse laser beam 1, emitted from the excitation laser part that includes an excitation laser light source and condenser optical system (not shown), is configured to condense at a position of the emission point 2, and forms a plasma light source section. The liquid drop as the target of this laser plasma light source, such as Xe, is configured to be continuously injected at regular time intervals from the nozzle 3a, and pass the condensed point 2. When the thus-injected liquid drop is located at the position of the element 2, the excitation pulse laser beam 1 irradiates liquid drops to generate the high-temperature plasma from the emission point 2, and the thermal radiation from this plasma generates the EUV light.

While the instant embodiment uses Xe liquid drops as a target, the target may use Xe gas injected into a vacuum, a cluster generated from an adiabatic expansion, solidified Xe gas that has been cooled on the metal surface, and a metal tape, such as Cu. Alternatively, the EUV light source can use an undulator, or a so-called discharge method, such as Z pinch method, a plasma focus, a capillary discharge, and hollow cathode triggered Z pinch.

The EUV light irradiated from the plasma emission point 2 is condensed by the condenser mirror 4, such as a rotational spheroid mirror, and taken out as a EUV beam. The filter 6a removes flying particles (or debris) that fly ahead directly from the plasma and its vicinity, and the filter 6b removes an unnecessary wavelength component for the EUV exposure, as required. Then, the light is condensed into the pinhole aperture 7 provided on a boundary surface between the vacuum chamber 8 that accommodates the plasma light source, and the vacuum chamber 21 that accommodates the exposure apparatus body. The connector 9 connects the vacuum chamber 8 that accommodates the light source to the vacuum chamber 21 that accommodates the exposure apparatus body.

The EUV light 5 that has passed through the aperture 7 is converted into approximately parallel light 10' by the parallelizing optical system that includes a concave mirror 10a that has an opening at its center, and a convex mirror 10b that has a smaller diameter than the concave mirror 10a. Here, the concave mirror 10a has an opening for light reflected by the convex mirror 10b, and the opening is located on the optical axis (or a rotationally symmetric axis) of the condenser mirror in the light source section. These mirrors 10a and 10b have a reflective surface of approximately rotational symmetry. Its optical axis approximately accords with the condenser mirror 4's optical axis (or a rotationally symmetric axis). Therefore, the EUV emission point 2 is located on or near the optical axis of the parallelizing optical system.

The above condenser mirror 4, and the mirrors 10a and 10b form a reflective multilayer for effectively reflect the EUV light, and become at high temperature during exposure since they absorb the radiant energy from the high-temperature plasma 2. Therefore, they are made of a material with high thermal conductivity, such as metal, and have cooling means (not shown), such as water cooling, for continuous cooling during exposure. A detailed description will now be given of this parallelizing optical system with reference to another figure.

Figure 9:
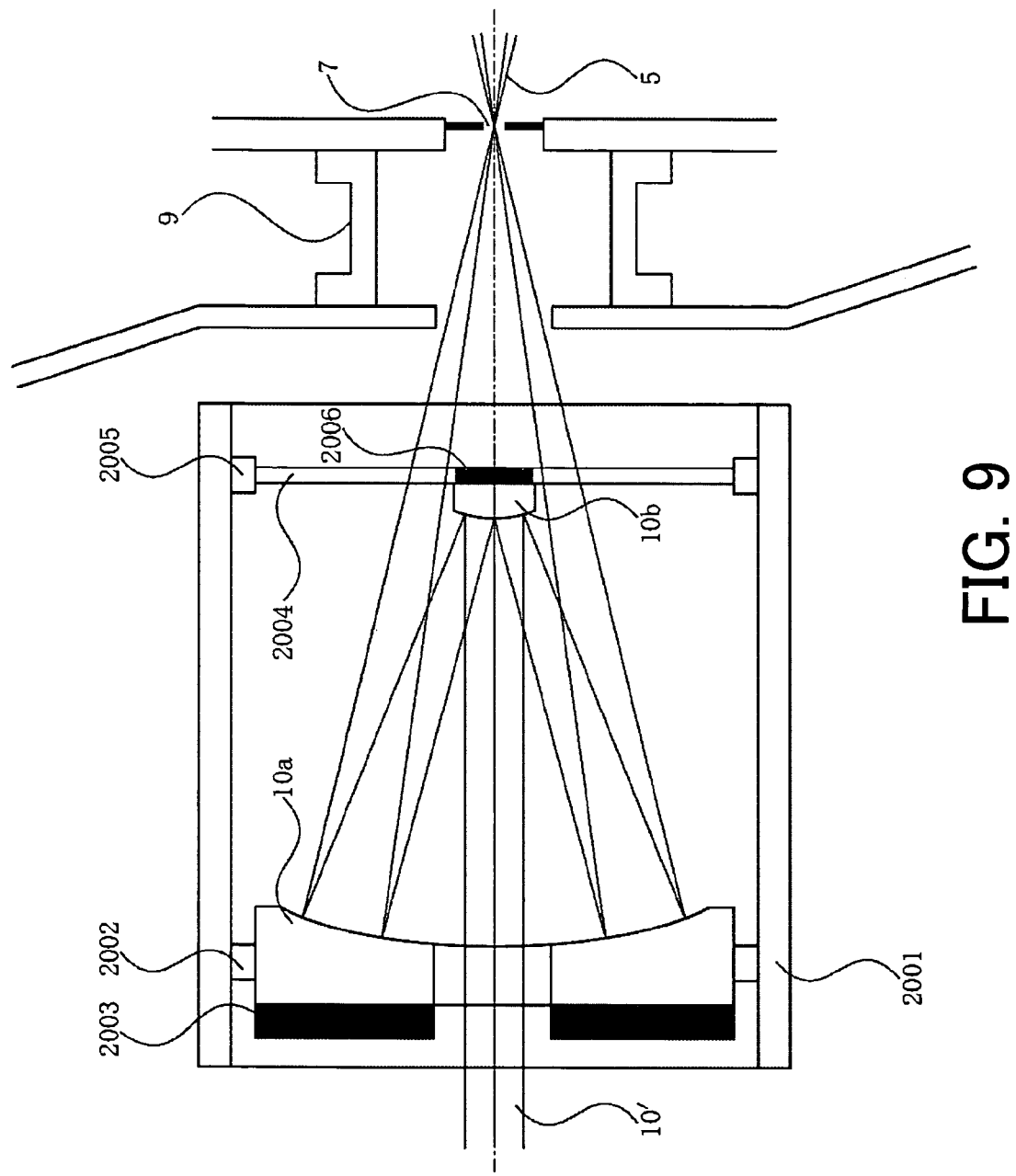
FIG. 9 is a schematic view of a parallelizing optical system.

FIG. 9 is a schematic view of a principal part of the above parallelizing optical system.

As illustrated, the mirror 10a is provided and integrated with a water cooling mechanism 2003 on its rear surface, and cooled from its rear surface when a cooling water circulation system (not shown) circulates the water in this cooling mechanism. The mirror 10a is held in the mirror barrel by a holding mechanism 2002, which includes a position fine adjustment mechanism, such as a parallel linkage including a piezo-electric element, and precisely controls an orientation of the mirror 10a.

Similarly, provided on and integrated with the rear surface of the mirror 10b is a cooling mechanism 2006. The mirror 10b is held by two or more rods 2004. These rods 2004 contact the mirror barrel by a holding mechanism 2005, similar to the mirror 10a, and hold and precisely control the mirror 10b held in the mirror barrel.

The holding structure that utilizes the rods 2004 may employ, for example, four rods, arrange them orthogonal to each other, and fix the mirror 10b onto the cross center. Alternatively, the holding structure may arrange three rods at 120° angular intervals, and fix the mirror 10b onto the center. A rotationally symmetrical arrangement of the rods 2004 around the center would maintain the excellent illumination since the light distribution maintains the rotational symmetry in the light traveling direction even when the rod partially shields the EUV light 5.

The above rod 2004 is made of a rigid material, such as metal, and at least two rods 2004 are made hollow to flow cooling water. The cooling water circulation system (not shown) allows the cooling water to circulate in a cooling mechanism 2006 for the mirror 10b.

Figure 10:
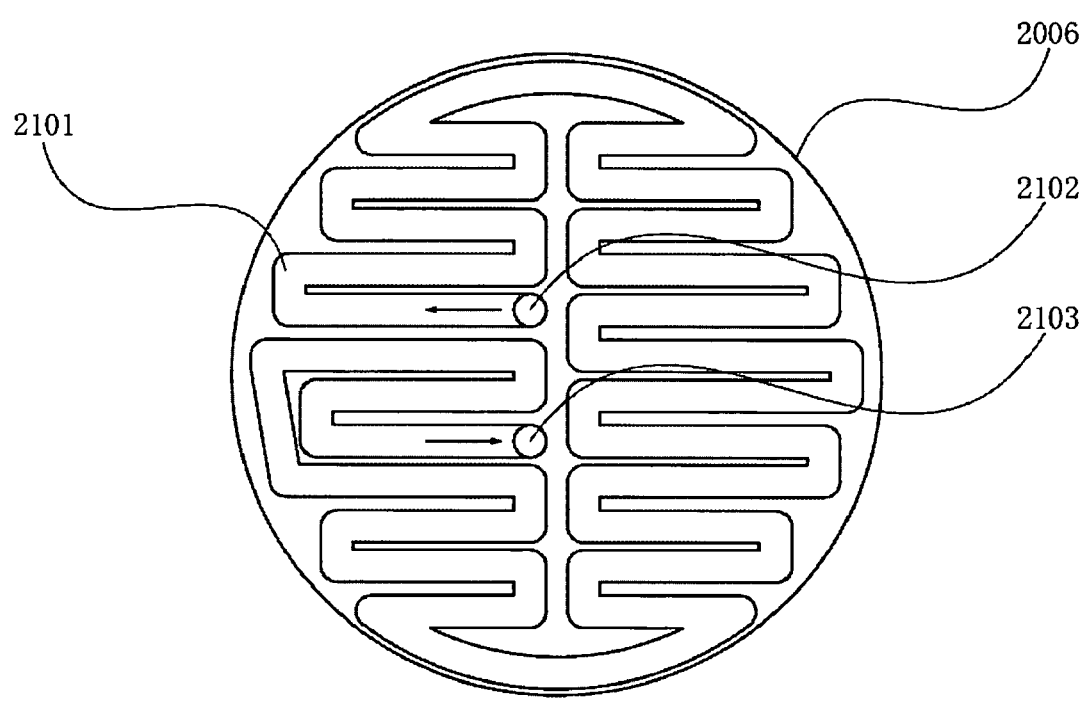
FIG. 10 is a view showing a channel in a cooling mechanism.
Figure 11:
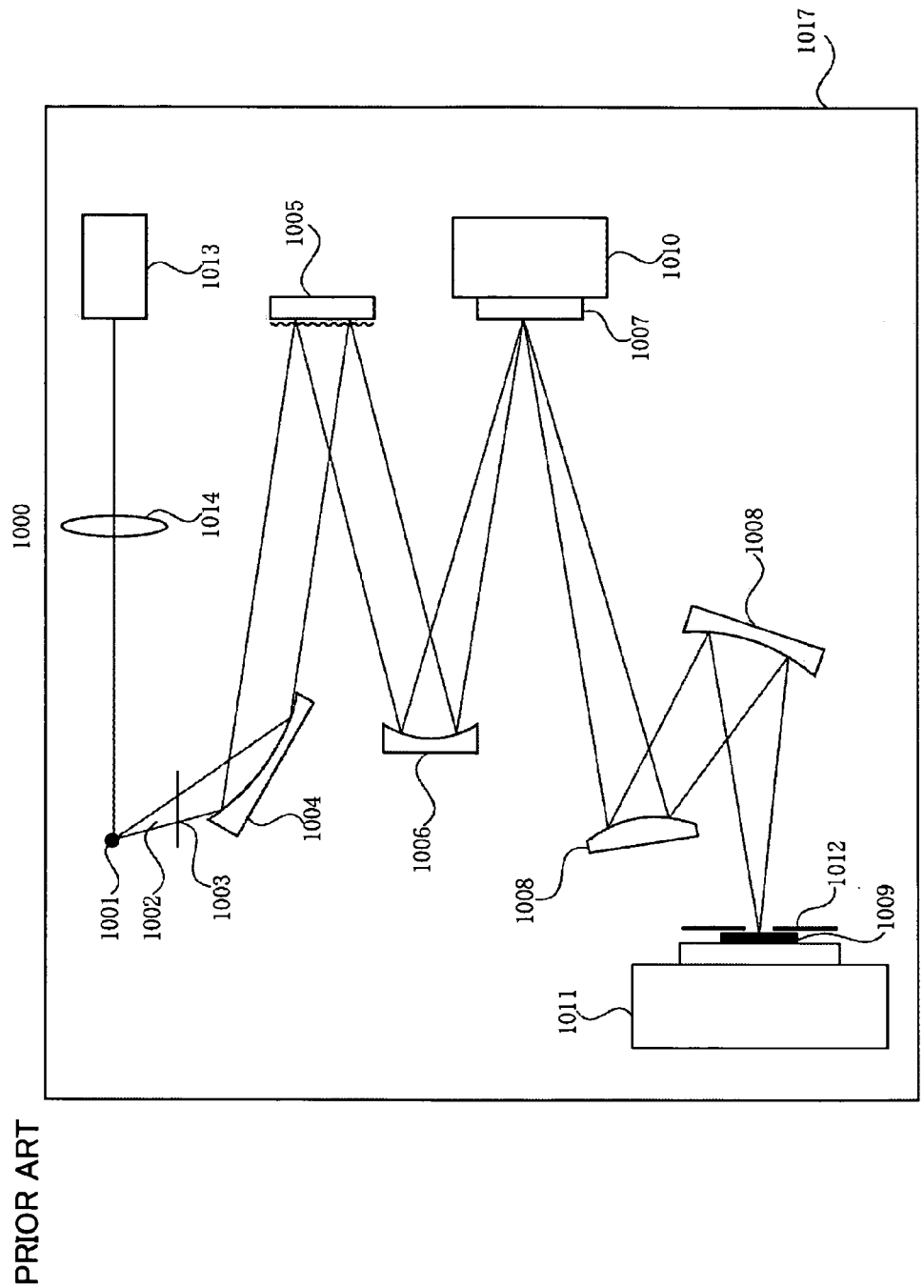
FIG. 11 is a schematic view of a prior art illustration.
Figure 12:
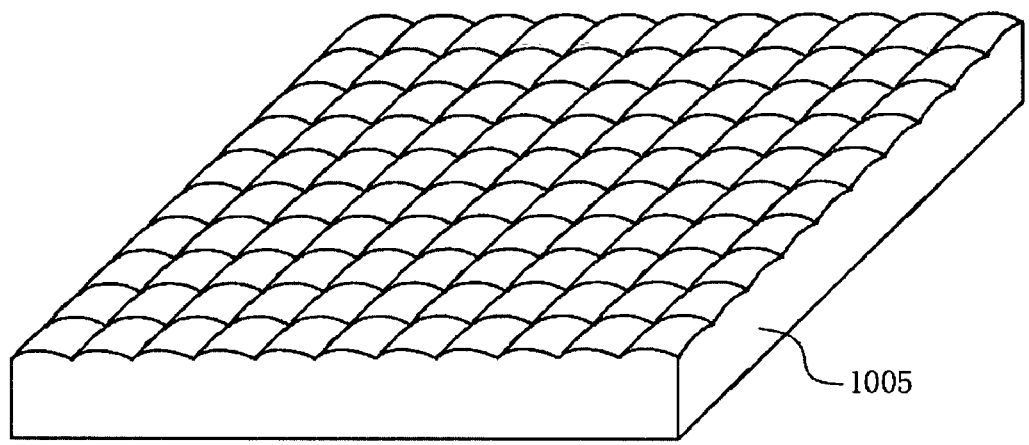
FIG. 12 is a schematic perspective view of a conventional reflection integrator.
Figure 13:
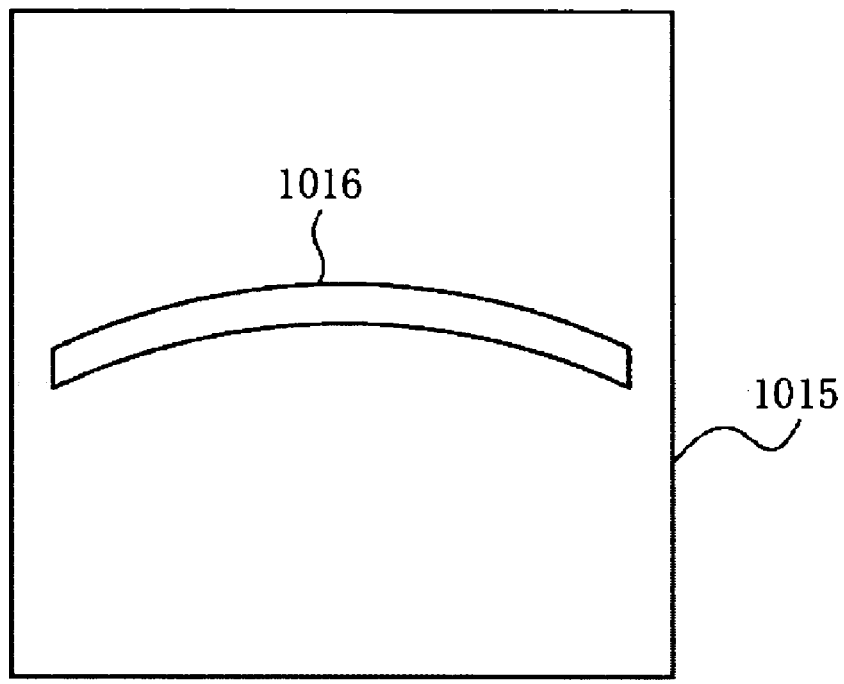
FIG. 13 is a view of a conventional illuminated area and an arc area to be exposed.

FIG. 10 is a view showing an embodiment of a channel, through which the cooling water flows, in the cooling mechanism 2006 integrated with the mirror 10b. This embodiment forms a channel like 2101 by digging a groove in a metal plate with a desired thickness. A hole perforates through channel's starting point 2102 and end point 2103 in a direction perpendicular to the paper surface, and a plug is attached to the hole and connected to the hollow rod so as to flow the cooling water in the rear surface of the metal plate.

Since this cooling mechanism 2006 is adhered to and integrated with the mirror 10b's rear surface, water does not leak out of the channel when the cooling water flows from the starting point 2102 to the end point 2103 in the channel 2101. As discussed, the mirror 10b is cooled as required, when the cooling water circulation system (not shown) supplies the cooling water to the cooling mechanism 2006 through the (hollow) rods 2004.

Although not described specifically, a reflective surface of each mirror in the optical system forms a reflective multilayer to effectively reflect the EUV light, and the mirror can be made of a material with high thermal conductivity, such as metal, as required.

The EUV light 10' that has been converted into approximately parallel light enters the integrator 11a that has plural reflective cylindrical mirrors, and the plane mirror 11b and the rotational paraboloid mirror 11c condense, into an arc shape, divergent beams divided by each cylindrical surface, thereby forming an arc illuminated area that has uniform light intensity distribution on the opening in the arc stop 12.

A detailed description will now be given of how the integrator 11a uniformly illuminates the arc area, with reference to another figure.

Figure 3A:
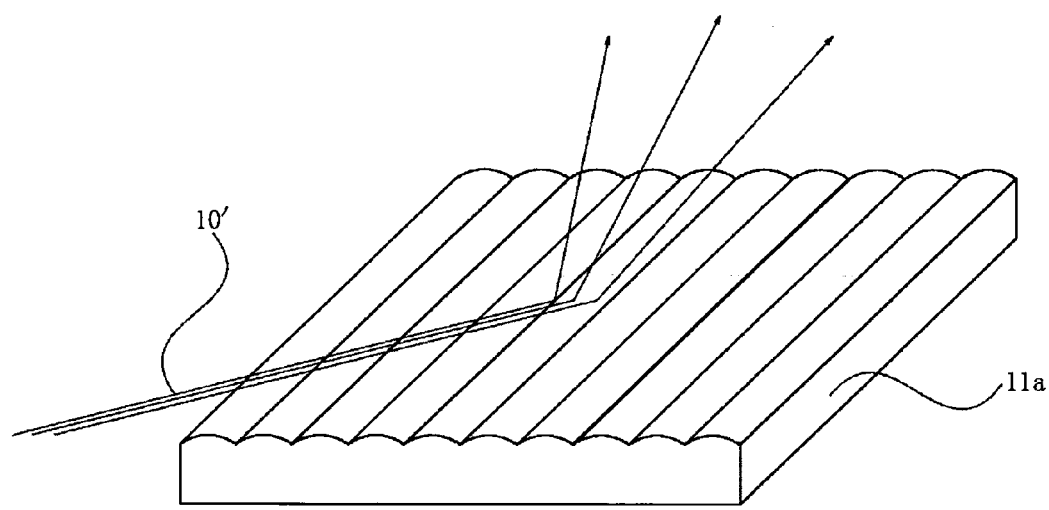
FIG. 3A is a schematic view of a reflection integrator having plural convex cylindrical surfaces.
Figure 3B:
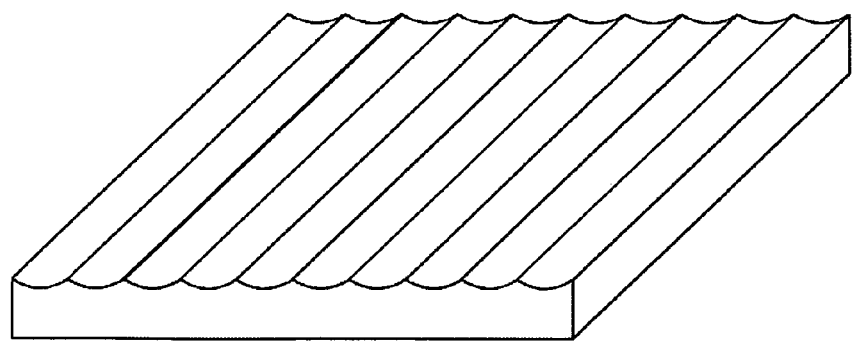
FIG. 3B is a schematic view of a reflection integrator having plural concave cylindrical surfaces.

FIG. 3A is a typical perspective view of the reflection convex cylindrical integrator 11a having plural convex cylindrical surfaces which receives parallel light, and the approximately parallel EUV light 10' enters in the illustrated direction. FIG. 3B is a typical perspective view of a reflection concave cylindrical integrator having plural concave cylindrical surfaces that exhibit similar effects to FIG. 3A. The integrator 11a in FIG. 1 is a reflection convex cylindrical integrator, as shown in FIG. 3A, but it may be a reflection concave cylindrical integrator shown in FIG. 3B or a combination thereof.

Figure 4:
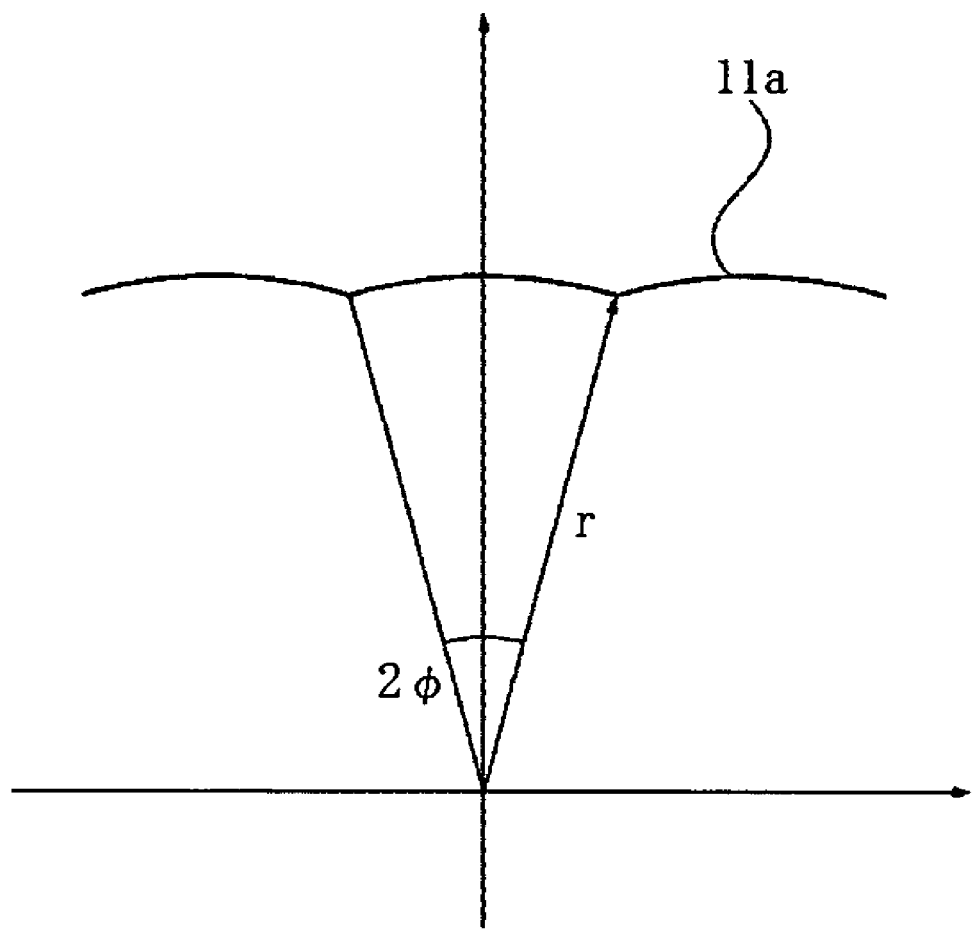
FIG. 4 is a view of a sectional shape of the integrator.
Figure 5:
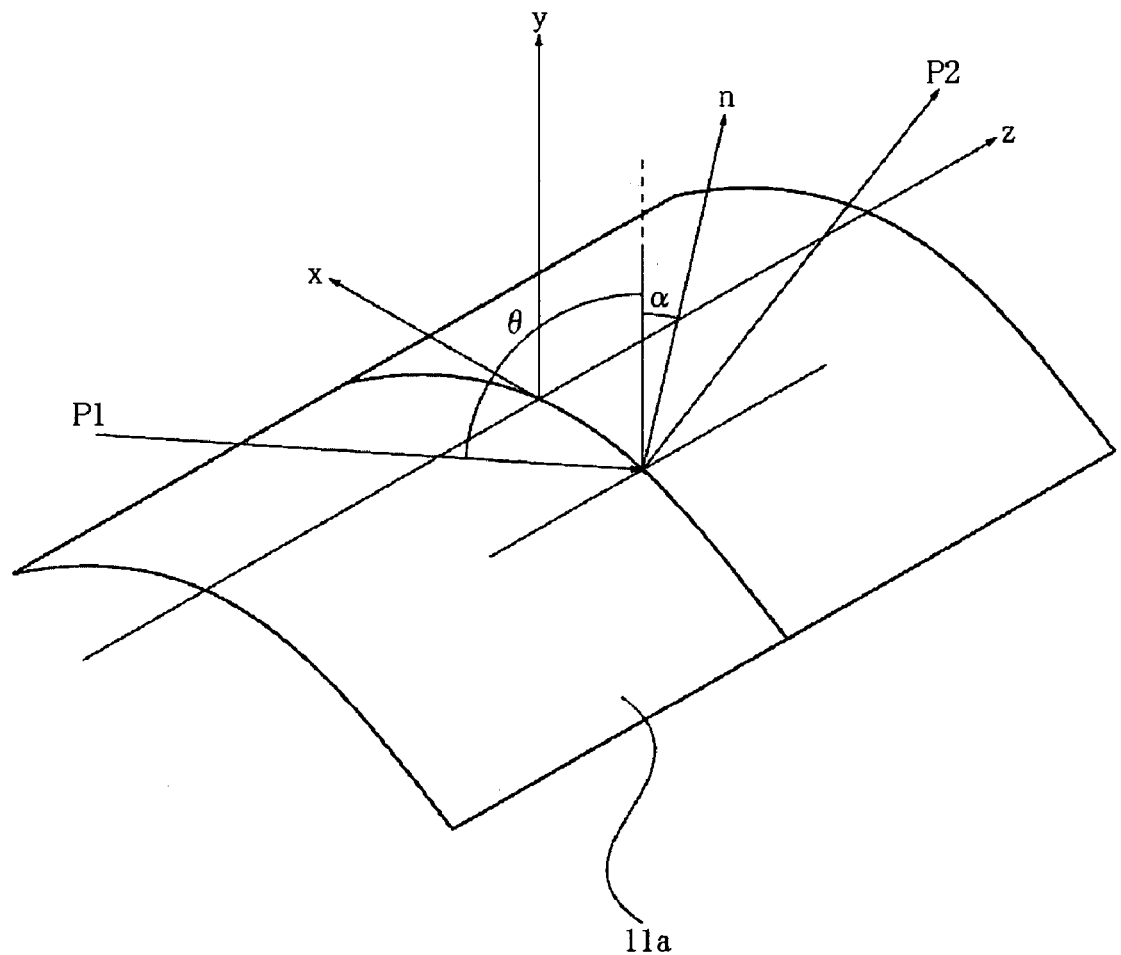
FIG. 5 is a view for explaining an angular distribution of light reflected on a cylindrical surface.
Figure 6:
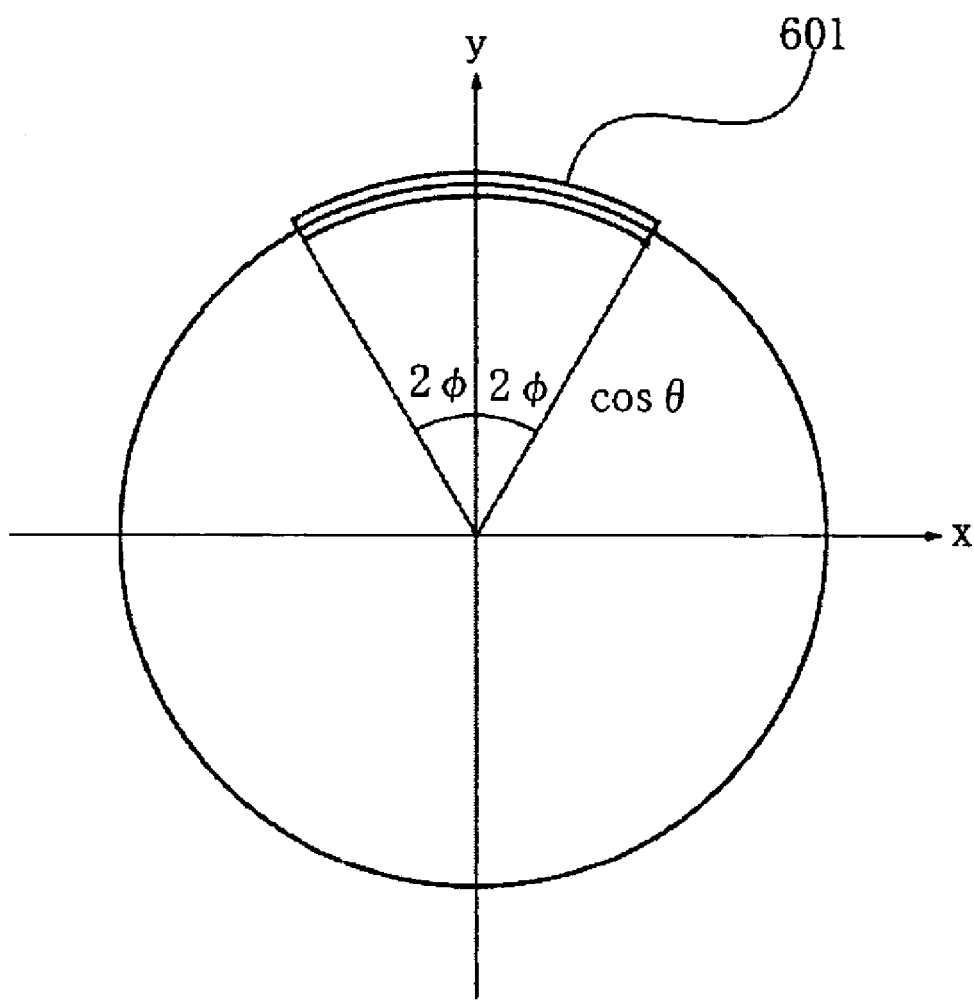
FIG. 6 is a view showing an arc area formed by the light reflected on the cylindrical surface.

FIG. 4 is a typical sectional view of the reflection convex cylindrical integrator, FIG. 5 is a view for explaining reflections of the EUV light on the cylindrical surface of the reflection convex cylindrical integrator, and FIG. 6 is an angular distribution diagram of the EUV light reflected the reflection convex cylindrical integrator. In each figure, reference numeral 11a denotes the reflection convex cylindrical integrator.

As shown in FIG. 3A, when approximately parallel EUV light 11 is incident upon the integrator 11a having plural cylindrical surfaces, the secondary light source is formed near the integrator surface and the EUV light radiated from this secondary light source has a cone angular distribution. Then the arc illumination is available by reflecting the EUV light on the mirror that has a focal point at a position of this secondary light source, and illuminating the reflection mask or a surface conjugate with the reflection mask.

In order to explain operations of the reflection integrator having plural cylindrical surfaces, a description will now be given of a behavior of the reflected light when the parallel light is incident upon one cylindrical mirror with reference to FIG. 5. It is now supposed that parallel light is incident upon one cylindrical surface at an angle θ to a surface perpendicular to the center axis.

When a ray vector of the incident parallel light is defined as P1=(0, −cos θ, sin θ), and a normal vector on the cylindrical reflective surface is defined as n=(−sin α, cos α, 0), the ray vector of the reflected light becomes P2=(−cos θ×sin 2α, cos θ×cos 2α, sin θ). The plotted ray vector of the reflected light in a phase space forms a circle with a radius of cos θ on an xy plane, as shown in FIG. 6. Therefore, the reflected light becomes cone divergent light, and the secondary light source is located on a vertex of this cone surface. When the integrator 11a has a concave cylindrical surface, this secondary light source exists as a real image outside the reflective surface, whereas when the integrator has a convex cylindrical surface, this secondary light source exits as a virtual image inside the reflective surface. As shown in FIG. 4, when the reflective surface is limited to part of the cylindrical surface and has a center angle of 2Φ, the ray vector P2 exists as an arc 601 having a center angle of 4Φ on the xy plane as shown in FIG. 6.

Then, suppose a rotational paraboloid mirror having a focal distance f and a focal point near the secondary light source's position that is formed as a result of parallel light incident upon the above cylindrical mirror, and an illuminated surface located apart from this mirror by the distance f. The secondary light source emits the cone divergent light, which is then reflected on the mirror having the focal distance f and then converted into parallel light. The reflected light is a sheet beam having an arc section with a radius f×cos θ and a center angle of 2Φ. Therefore, as shown in FIG. 6, only the arc area 601 is illuminated with a radius of f×cos θ and a center angle of 2Φ on the illuminated surface.

Figure 2:
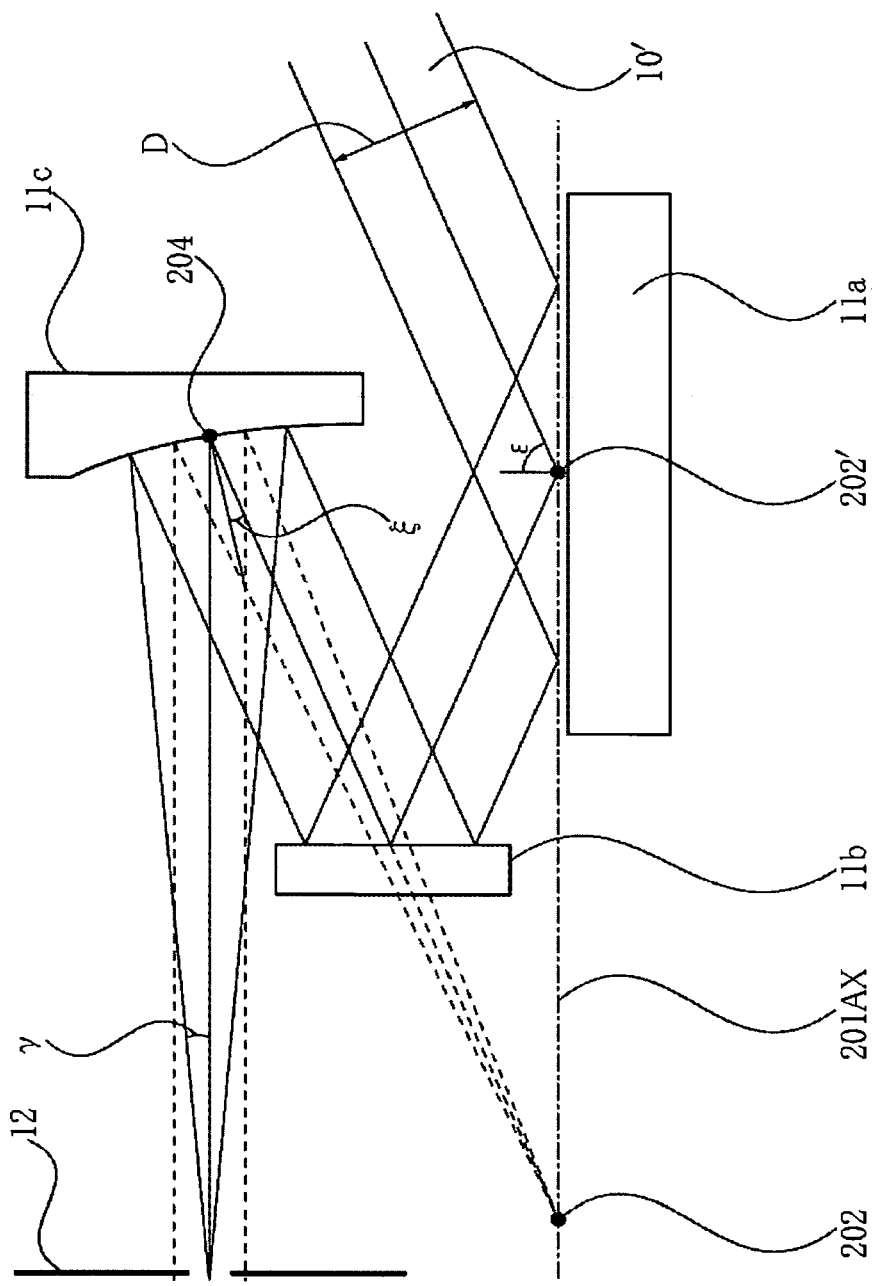
FIG. 2 is a view of an integrator that receives parallel light.

The foregoing description refers to one cylindrical mirror. Referring now to FIG. 2, a description will be given of the integrator 11a that arranges a multiplicity of cylindrical surfaces in parallel on a large area, and receives the parallel light 10' with a certain beam diameter in a direction shown in FIG. 1.

In FIG. 2, 11a is the above integrator, 11b is a plane mirror, 11c is a rotational paraboloid mirror, and 12 is an arc stop having an arc opening. The rotational paraboloid mirror 11c is a mirror that is centrically symmetrical around a shaft 201AX, and has a reflective surface that is part of a surface formed by rotating a paraboloid having a focal point 202 around an axis 201AX. A distance between the focal point 202 and the mirror effective part's center point 204 is the focal distance f. A distance between the point 204 and the arc stop 12 is set to be approximately equal to the focal distance f.

The rotational paraboloid mirror 11c is arranged so that its rotational axis 201AX is arranged parallel to the reflective surface near the reflective surface of the integrator 11a, and aligned with the cylindrical surfaces. As illustrated, the plane mirror 11b is located between the effective part's center point 204 and the focal point 202 on the rotational paraboloid mirror 11c, the point 202' that is symmetrical to the focal point 202 with respect to the reflective surface of the mirror 11b can be located approximately at a center position of the reflective surface's effective part on the integrator 11a. In other words, an optical path length from the position 204 to the position 202' is equal to the focal distance f.

This arrangement provides the position 202' and the arc stop 12 with a separation by the focal distance f from the rotational paraboloid mirror 11b or a relationship of the Fourier conversion surface. Therefore, the approximately parallel EUV light 10' incident upon the integrator 11a as illustrated is condensed near the opening of the arc stop 12.

The EUV light to the rotational paraboloid mirror 11c has a low incident angle ξ of the primary ray between 0° and 45°, more specifically, 20°. Thereby, the defocus amount reduces when light is condensed in the arc slit 12 and condensing efficiency improves near the arc opening rather than the high incident angle. Thereby, the optical loss due to shielding reduces, and the illumination system's efficiency improves.

Since the light reflected on the mirror that arranges plural cylindrical surfaces in parallel has the same angular distribution as the above, the arc area is illuminated with a radius f×cos ε near the arc stop 12, where ε is a light incident angle to the integrator 11a. Since the light incident upon one point near the arc stop 12 results from the entire illuminated area that arranges plural cylindrical surfaces in parallel, the angular range Y, i.e., condensing NA, becomes Y=D/f, where D is a beam diameter of the approximately parallel EUV light 10'.

In this case, the arc illuminated area maintains uniform light intensity since the multiple cylindrical surfaces on the integrator 11a superimpose the light. In other words, this can achieve effective and uniform arc illumination.

Turning back to FIG. 1, a description will be given of the exposure apparatus of the instant embodiment. As illustrated, the masking blade 13 partially restricts the arc illuminated area formed near the opening in the arc stop 12, and the masking imaging system 14 enlarges or reduces the arc illuminated area at a desired magnification. As a consequence, the reflection mask 16 is illuminated with an arc shape by introducing the arc illuminated area at a desired incident angle into the reflection mask 16 held by the mask stage 17. The center of curvature of the arc illuminated area accords with the optical axis 18AX of the projection optical system 18.

The circuit pattern is exposed when the projection optical system 18 projects, onto the wafer 19 that applies a photosensitive material, at a magnification suitable for exposure, the reflected EUV light having circuit pattern information from the reflection mask 16 that has been illuminated in an arc shape.

The above wafer is fixed on the wafer stage 20, which serves to provide back and forth and up and down parallel movements on the paper surface-under control of distance measuring equipment, such as a laser interferometer (not shown). The scan exposure over the entire surface requires, for example, the reflection mask 16 to be scanned at a speed v in a direction parallel to the paper surface and the wafer 19 to be simultaneously synchronously scanned at a speed v/M in the direction parallel to the paper, where M is a magnification of the projection optical system 18.

The projection optical system 18 is comprised of plural multilayer reflective mirrors, and provided with excellent imaging performance in an off-axis, thin arc area. The projection optical system 18 is configured to project a reduced size of the pattern on the mask 16 onto the wafer 19 surface, and form an image-side (or wafer-side) telecentric system. The projection optical system 1008 provides an object side (or the reflection mask side) with a non-telecentric structure so as to avoid physical interference with the illumination light incident upon the reflection mask 16, and the instant embodiment inclines the image-side principal ray, for example, by about 6° relative to the normal direction of the mask 16.

A detailed description will now be given of (1) scan exposure using the arc illumination, (2) a method of correcting uneven exposure by using the arc stop 12, and (3) a structure of a masking imaging system in this order.

Figure 7A:
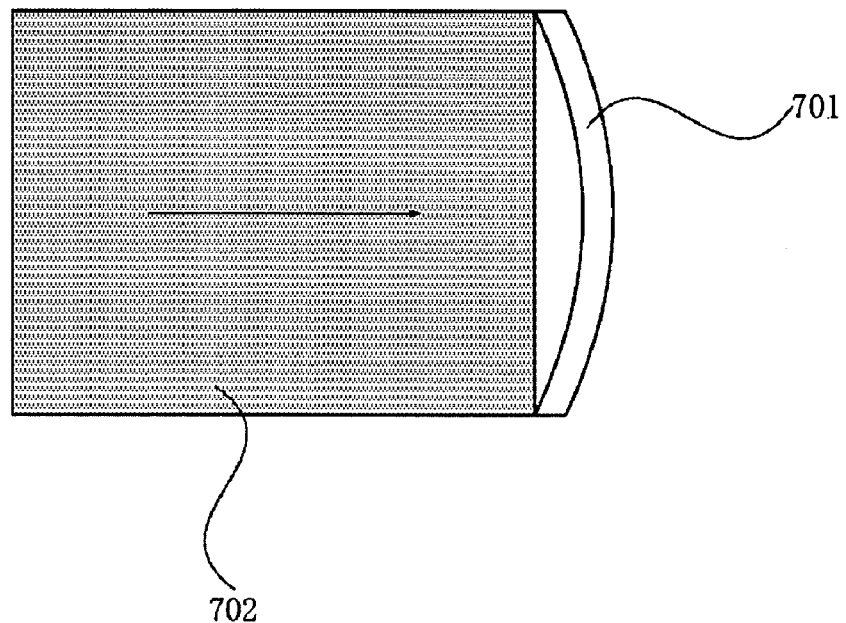
FIG. 7A is a view in a scan exposure start state.
Figure 7B:
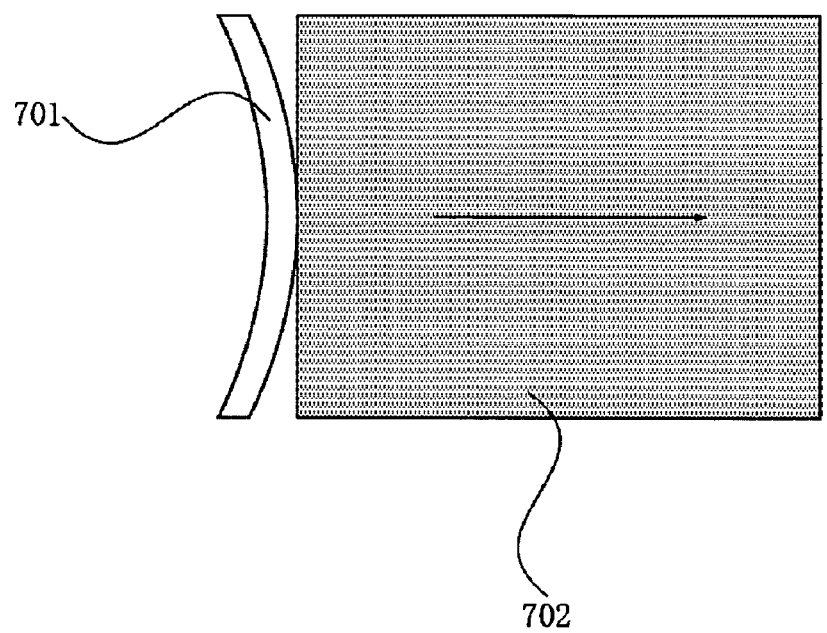
FIG. 7B is a view in a scan exposure end state.
Figure 8:
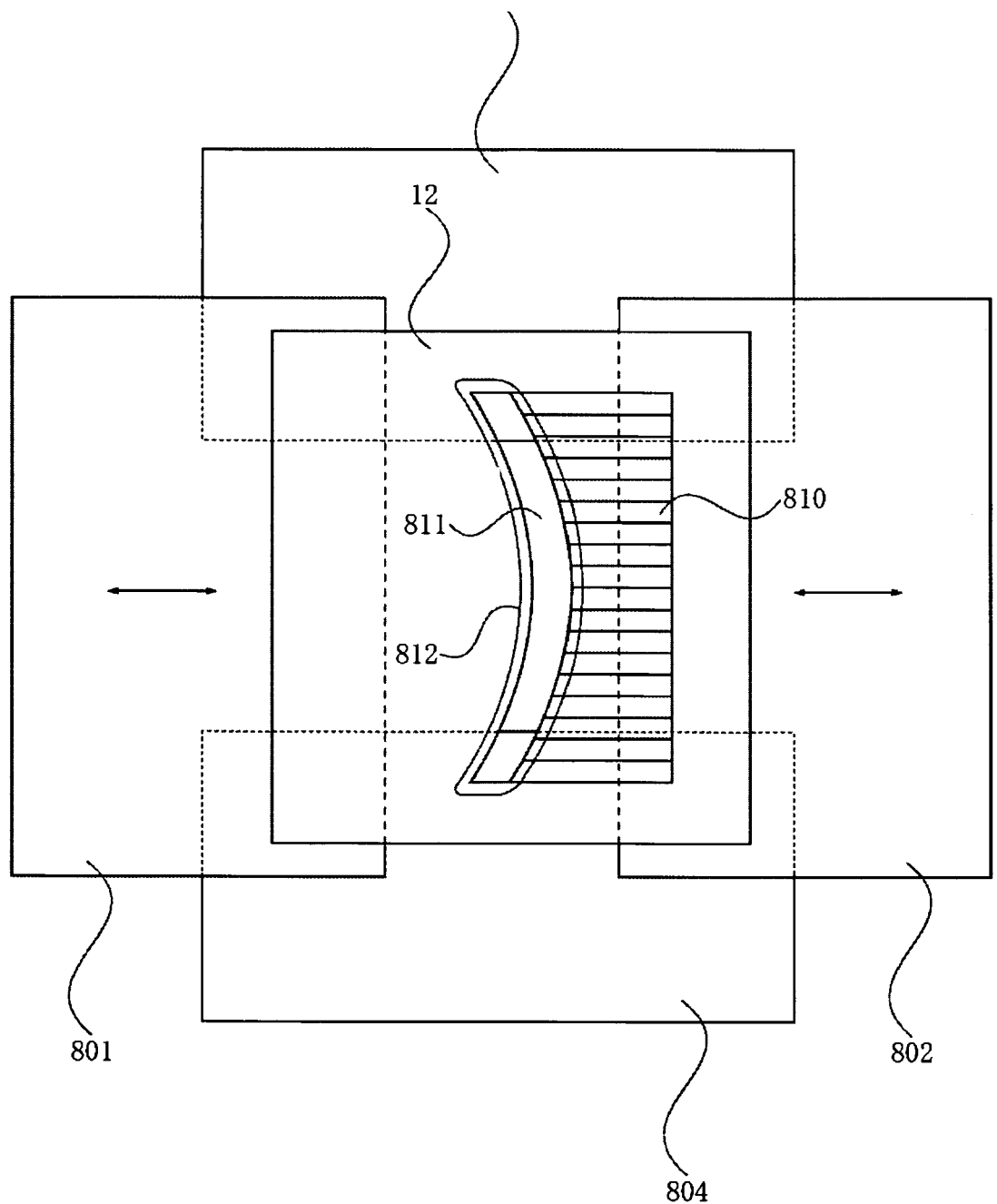
FIG. 8 is a schematic view of a variable arc stop and a masking blade.

FIGS. 7A and 7B show scan exposure start and end states on the wafer surface, respectively. As illustrated, 701 denotes an arc illuminated area on the wafer surface. 702 denotes an exposed area as an object to be exposed. In this figure, the exposure area 702 moves from left to right on the paper when the wafer stage is driven. The arc illuminated area 701 is configured to relatively scan the exposed area 702. The masking blade works so that the arc illuminated area 701 is prevented from illuminating part except for the exposure area 702 at the exposure start and exposure end. This will be described in the operation of the masking blade. The above is applicable to scan exposure in a relatively reverse direction to the scanned direction in this embodiment.

A detailed description will be given of a method of correcting an uneven exposure with the arc stop 12 in the above scan exposure. As illustrated, 810 denotes a multiple movable edges for partially changing a slit width 811 in the arc stop 12. 811 denotes a slit opening for forming the arc illuminated area. 812 denotes an arc illuminated area formed by the above integrator 11a and mirror system 11b and 11c, and this illuminated area defines light that passes through the slit opening 811.

The uneven exposure occurs if there is uneven light intensity in the arc slit when the scan exposure transfers a reduced size of the circuit pattern in the reflection mask 16 onto the wafer 19. One solution for this problem uses a drive system (not shown) to move the movable edges 810 to narrow only the slit width that provides relatively strong light intensity in the arc slit, and to reduce the light amount for the scan exposure by a desired amount. As a result, exposure with uniform intensity is available on the entire exposed surface as a result of accumulation.

The masking blade 13 includes four light-shielding plates 801, 802, 803 and 804, the upper and lower light-shielding plates 803 and 804 shield light at both ends of the arc illuminated area 812 in the arc slit opening 812, and define a longitudinal width (or a scan width) of the exposed area 702 shown in FIG. 7A.

The light-shielding plates 801 and 802 define a lateral width (or a scan length) in the exposed area 702 by moving in a lateral direction and opening and closing an aperture from the exposure start to the exposure end for one shot in the scan exposure.

As shown in FIG. 1, the masking imaging system 14 is an imaging optical system that uses the above masking blade 13 as an image surface, and the reflection mask 16 (at a position 102 in the figure) as an image surface, and includes reflective multilayer mirrors. This imaging system serves to image and form an arc illuminated area suitable for the projection optical system 18 by applying a desired magnification to the object-side arc area that arranges the axis 10A nearly at a center. The imaging surface properly corrects defocus at the image side, and the spot diameter on the image surface is designed to be 5 mm or smaller, preferably 1 mm or smaller.

As illustrated, 14a, 14b, 14c and 14d are concave or convex spherical or aspheric mirrors that use the center axis 10AX for rotational symmetry, and are concave, concave, convex and concave from 14a in the instant embodiment. The pupil surface in the masking imaging system 14 is located near the reflective surface of the mirror 14b, at which the aperture stop 15 is located. The aperture stop 15 changes its opening pattern to change a convergent angle (or a so-called coherence factor σ) of the illumination light at the reflection mask side, or to provide modified illumination.

When the plane mirror 14e reflects the image-side light 14' of the masking imaging system 14 shown in FIG. 1 and angles it toward the reflection mask 16, an orientation of an arc illuminated area formed by the light 14' is reversed and the arc's center accords with an intersection between the center axis 18AX of the projection system 18 and the reflection mask. The principal ray of the light 14' is configured to accord with the principal ray of the object-side light 18' of the projection optical system 18 with respect to a reflective surface on the reflection mask.

Use of the illumination apparatus of the instant embodiment would (1) achieve effective and uniform arc illuminations and reduces uneven light intensity; (2) realize a well-focused arc illumination on the mask surface; (3) correct uneven light intensity sufficiently; and (4) switch a coherence factor σ and provide modified illumination. Therefore, the instant embodiment provides an illumination optical system suitable for an exposure apparatus.

SECOND EMBODIMENT

Figure 14:
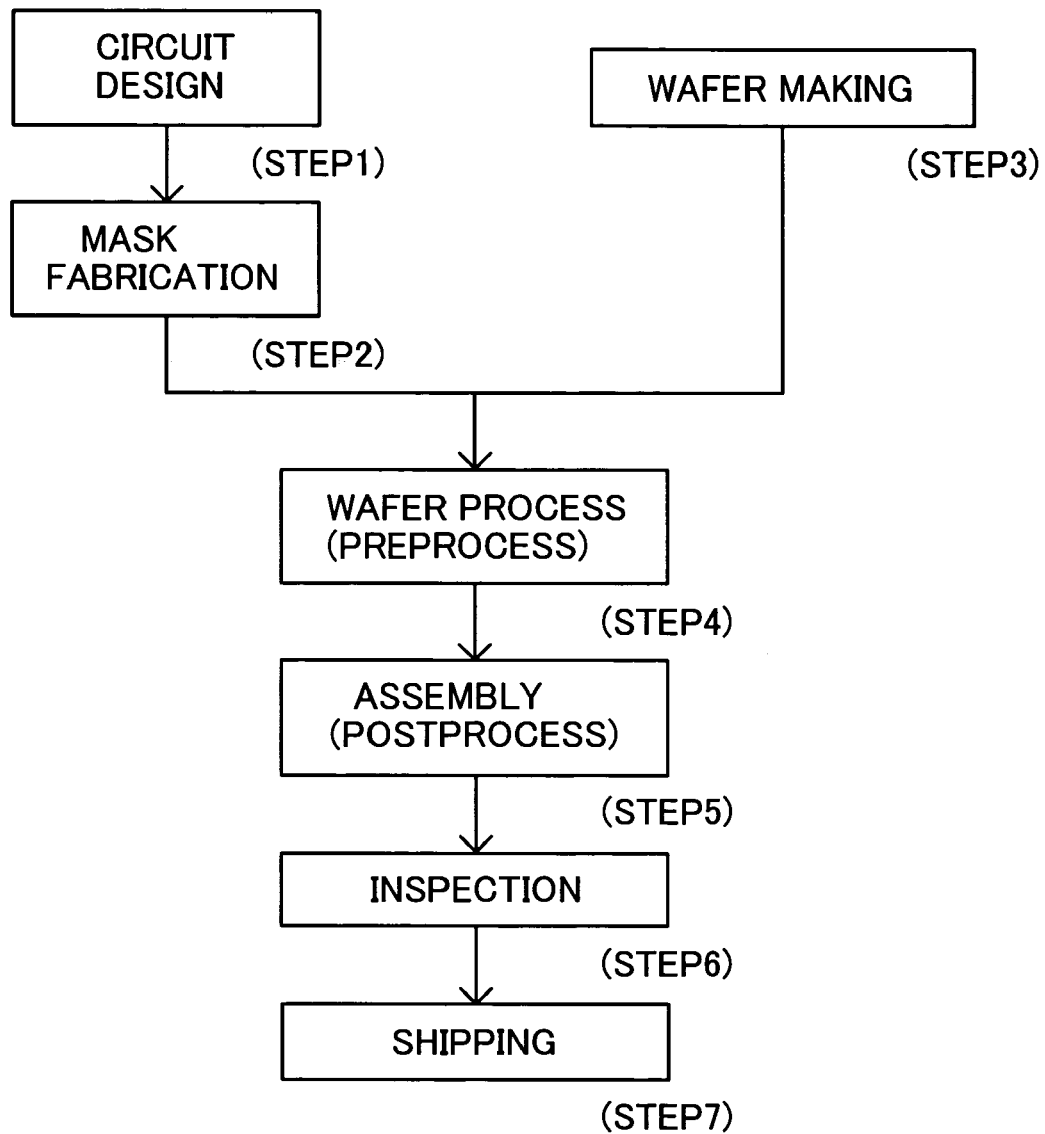
FIG. 14 is a flowchart for explaining a method for fabricating devices (semiconductor chips such as ICs, LSIs, and the like, LCDs, CCDs, etc.).

A description will now be given of an embodiment of a device fabricating method using the exposure apparatus of the first embodiment. FIG. 14 is a manufacture flow for explaining a fabrication of devices (i.e., semiconductor chips such as IC and LSI, LCDs, CCDs, etc.). Here, a description will be given of a fabrication of a semiconductor chip as an example. Step 1 (circuit design) designs a semiconductor device circuit. Step 2 (mask fabrication) forms a mask having a designed circuit pattern. Step 3 (wafer making) manufactures a wafer using materials such as silicon. Step 4 (wafer process), which is referred to as a pretreatment, forms actual circuitry on the wafer through photolithography using the mask and wafer. Step 5 (assembly), which is also referred to as a post-treatment, forms into a semiconductor chip the wafer formed in Step 4 and includes an assembly step (e.g., dicing, bonding), a packaging step (chip sealing), and the like. Step 6 (inspection) performs various tests for the semiconductor device made in Step 5, such as a validity test and a durability test. Through these steps, a semiconductor device is finished and shipped (Step 7).

Figure 15:
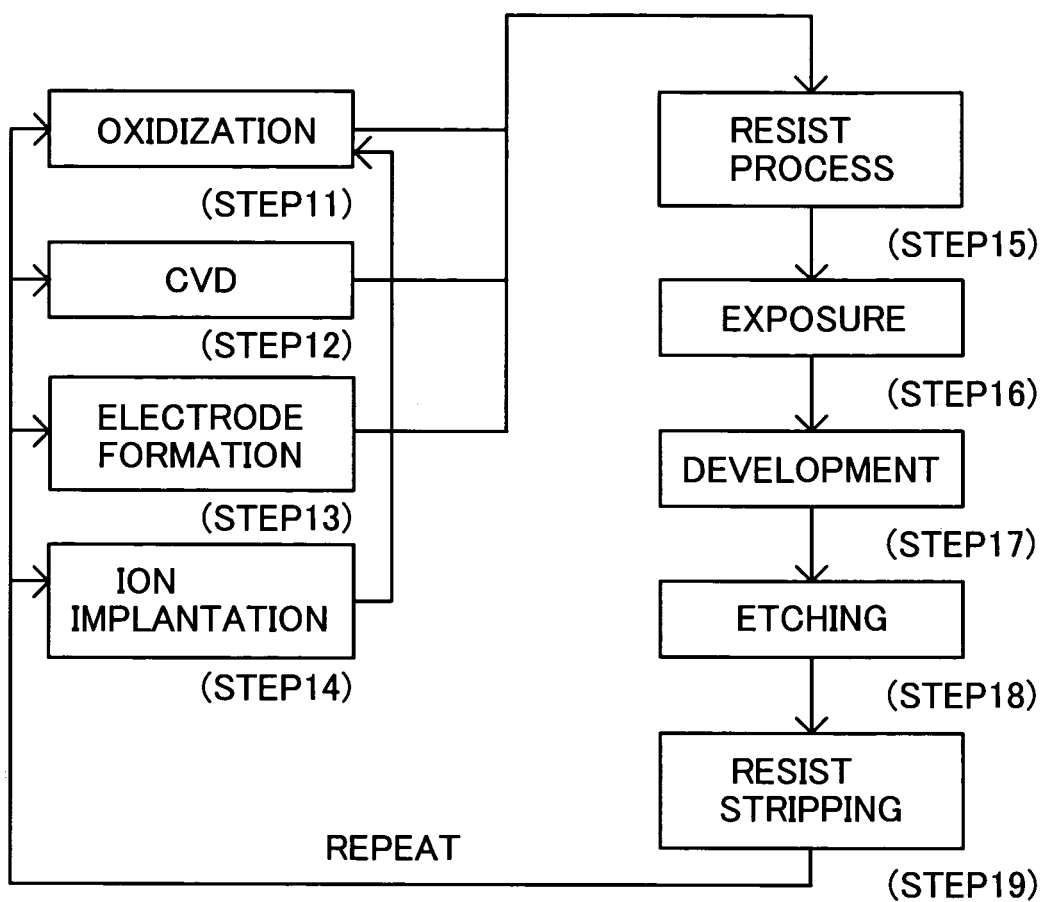
FIG. 15 is a detailed flowchart for Step 4 of wafer process shown in FIG. 14.

FIG. 15 is a detailed flow of the above wafer process. Step 11 (oxidation) oxidizes the wafer's surface. Step 12 (CVD) forms an insulating film on the wafer's surface. Step 13 (electrode formation) forms electrodes on the wafer by vapor disposition and the like. Step 14 (ion implantation) implants ion into the wafer. Step 15 (resist process) applies a photosensitive material onto the wafer. Step 16 (exposure) uses the exposure apparatus of the first embodiment to expose a circuit pattern on the mask onto the wafer. Step 17 (development) develops the exposed wafer. Step 18 (etching) etches parts other than a developed resist image. Step 19 (resist stripping) removes disused resist after etching. These steps are repeated, and a circuit pattern is formed on the wafer.

Use of the manufacture method of the instant embodiment would be able to manufacture highly integrated devices, which have been difficult to be manufactured.

While the above embodiments describe the illumination system that uses the EUV light of 13.5 nm, the present invention is applicable to another illumination optical system that uses different light, for example, light in an EUV or E-ray region with a wavelength between 10 nm and 200 nm. No glass material is applicable as a lens for light with a wavelength between 20 and 50 nm, and the optical system should include mirrors only. Therefore, the present invention is effectively applicable to the illumination optical system that uses this region.

As many apparently widely different embodiments of the present invention can be made without departing from the sprit and scope thereof, it is to be understood that the invention is not limited to the specific embodiments thereof except as defined in the claims.

What is claimed is:

1. An illumination optical system for illuminating an object surface, said illumination optical system comprising an optical unit that converts a light having a wavelength between 5 and 20 nm from a light source section into an approximately parallel light, and consists of first and second mirrors, each of the first and second mirrors having a reflection surface that is approximately rotationally symmetrical round an optical axis of the optical unit, the first mirror introducing the light from the light source section to the second mirror, wherein the first mirror has an opening on the optical axis, through which light reflected by the second mirror passes, and wherein an emission point of the light source section is located on or near a rotationally symmetric axis of the optical unit.

2. An illumination optical system according to claim 1, further comprising:
    a reflection integrator for forming plural secondary sources using light from said optical unit; and
    a mirror unit for superimposing light from the plural secondary light sources onto the object surface.

3. An illumination optical system according to claim 2, wherein the integrator has a reflective surface with plural convex or concave cylindrical surfaces or a combination thereof.

4. An illumination optical system according to claim 2, wherein said mirror unit has an arc forming optical unit for condensing light from the secondary light sources into an arc illuminated area.

5. An illumination optical system according to claim 4, wherein the arc forming optical unit includes a curved mirror that has a focal point near a reflective surface of the integrator, and at least one mirror, light incident upon the curved surface having an angle of 45° or smaller.

6. An illumination optical system according to claim 5, wherein the curved mirror is a rotational paraboloid mirror.

7. An illumination optical system according to claim 5, wherein the angle is 20° or smaller.

8. An illumination optical system according to claim 4, wherein the mirror unit includes:
    an arc stop that has an arc opening arranged at or near a surface on which the arc illuminated area is formed;
    a masking blade; and
    a masking imaging unit for enlarging or reducing the arc opening at a predetermined magnification and for imaging the arc opening onto the object surface.

9. An illumination optical system according to claim 1, wherein the light source section includes a condenser mirror, and the opening is located on an optical axis of the condenser mirror.

10. An illumination optical system according to claim 1, wherein the first mirror is a concave mirror, and the second mirror is a convex mirror.

11. An illumination optical system according to claim 10, further comprising two or more rods for fixing the convex mirror, at least two of the rods having a channel that flows coolant.

12. An illumination optical system according to claim 1, wherein the first and second mirrors have a cooling mechanism that includes a channel that flows coolant.

13. An illumination optical system according to claim 1, wherein the light source section includes a condenser mirror, and
    wherein said illumination optical system further comprises an aperture having a pinhole, arranged near a condensed point of the condenser mirror of the light source section.

14. An illumination optical system according to claim 1, wherein the optical axis accords with a rotationally symmetrical axis of a condenser mirror in the light source section.

15. An exposure apparatus comprising:
    an illumination optical system for illuminating a mask that forms a pattern, said illumination optical system including an optical unit that converts a light having a wavelength between 5 and 20 nm from a light source section into an approximately parallel light, and consists of first and second mirrors, each of the first and second mirrors having a reflection surface that is approximately rotationally symmetrical around an optical axis of the optical unit, the first mirror introducing the light from the light source section to the second mirror, wherein the first mirror has an opening on the optical axis, through which light reflected by the second mirror passes, and wherein an emission point of the light source section is located on or near a rotationally symmetric axis of the optical unit; and
    a projection optical system for projecting the pattern on the mask onto a substrate.

16. A device fabricating method comprising the steps of:
    exposing an object using an exposure apparatus; and
    developing the exposed object,
    wherein said exposure apparatus includes:
    an illumination optical system for illuminating a mask that forms a pattern, said illumination optical system including an optical unit that converts a light having a wavelength between 5 and 20 nm from a light source section into an approximately parallel light, and consists of first and second mirrors, each of the first and second mirrors having a reflection surface that is approximately rotationally symmetrical around an optical axis of the optical unit, the first mirror introducing the light from the light source section to the second mirror, wherein the first mirror has an opening on the optical axis, through which light reflected by the second mirror passes, and wherein an emission point of the light source section is located on or near a rotationally symmetric axis of the optical unit; and
    a projection optical system for projecting the pattern on the mask onto a substrate.

* * * * *